US012525693B1

(12) United States Patent
Lee et al.

(10) Patent No.: US 12,525,693 B1
(45) Date of Patent: Jan. 13, 2026

(54) EBG-BASED ELECTRONIC FILTER USING MULTI-LAYER AND MULTI-CELL STRUCTURE

(71) Applicant: Amazon Technologies, Inc., Seattle, WA (US)

(72) Inventors: Je Kyung Lee, Sunnyvale, CA (US); Anuj Modi, Sunnyvale, CA (US); Tzung-I Lee, San Jose, CA (US); Cheol Su Kim, San Jose, CA (US)

(73) Assignee: Amazon Technologies, Inc., Seattle, WA (US)

( * ) Notice: Subject to any disclaimer, the term of this patent is extended or adjusted under 35 U.S.C. 154(b) by 312 days.

(21) Appl. No.: 18/101,852

(22) Filed: Jan. 26, 2023

(51) Int. Cl.
| | |
|---|---|
| *H01P 1/20* | (2006.01) |
| *H01P 1/203* | (2006.01) |
| *H01R 13/7197* | (2011.01) |
| *H03H 1/00* | (2006.01) |
| *H01P 1/212* | (2006.01) |

(52) U.S. Cl.
CPC ........ *H01P 1/2005* (2013.01); *H01P 1/20327* (2013.01); *H01P 1/20345* (2013.01); *H01R 13/7197* (2013.01); *H03H 1/0007* (2013.01); *H01P 1/212* (2013.01)

(58) Field of Classification Search
CPC . H01P 1/2005; H01P 1/20345; H01P 1/20327
USPC ................. 333/202–205, 236–238, 245–246
See application file for complete search history.

(56) References Cited

U.S. PATENT DOCUMENTS

| | | | |
|---|---|---|---|
| 2008/0116995 A1 | 5/2008 | Kim et al. | |
| 2012/0109338 A1* | 5/2012 | Matekovits | H01P 3/081 700/12 |

OTHER PUBLICATIONS

Raza, "Characterization of the Reflection and Dispersion Properties of 'Mushroom'-Related Structures and their Application to Antennas," Master of Applied Science, Graduate Department of Electrical and Computer Engineering, University of Toronto, 2012, 126 pages.
Shahid et al., "Bandstop Filter Synthesis Scheme for Reactively Loaded Microstrip Line Based 1-D Periodic Structures," Digital Object Identifier 10.1109/ACCESS.2020.3019076, vol. 8, Aug. 24, 2020, pp. 155492-155505.
Shahid et al., "Periodic Structures for Reconfigurable Filter Design," IEEE Mircrowave Magazine, vol. 22, No. 11, Nov. 2021, pp. 38-51.
Sievenpiper et al., "High-impedance Electromagnetic Surfaces with a Forbidden Frequency Band," IEEE Transactions on Microwave Theory and Techniques vol. 47, No. 11, Nov. 1999, pp. 2059-2074.
Lee et al., U.S. Appl. No. 18/217,016 , Tunable Hybrid EBG-Based Electronic Filter With Discrete Reactive Elements, filed Jun. 30, 2023.

(Continued)

*Primary Examiner* — Rakesh B Patel
(74) *Attorney, Agent, or Firm* — Kilpatrick Townsend & Stockton LLP

(57) ABSTRACT

An electronic filter includes a ground plane and a top conductor overlying the ground plane. The top conductor includes an input and an output for receiving and outputting signals, respectively. The filter further includes a plurality of unit cells arranged in series along the top conductor. Each of the plurality of unit cells includes a planar structure disposed between the top conductor and the ground plane. Each of the plurality of unit cells further includes a pair of vias connecting the planar structure to the ground plane.

20 Claims, 15 Drawing Sheets

(56) References Cited

OTHER PUBLICATIONS

Modi et al., U.S. Appl. No. 19/092,557, "Common-Mode Choke Implemented on Printed Circuit Board," filed Mar. 27, 2025.
Lee et al., U.S. Appl. No. 19/234,118, "Electromagnetic Bandgap Filter Implemented in PCB With Through-Hole Vias," filed Jun. 10, 2025.

* cited by examiner

EBG-BASED ELECTRONIC FILTER USING MULTI-LAYER AND MULTI-CELL STRUCTURE

BACKGROUND

An electronic filter is a two-port device (input port and output port) that allows signals of certain bands of frequencies to pass through with very little attenuation, while stopping the passage of other bands of frequencies with very high attenuation. Types of filters include microwave filters, which operate at the microwave frequencies between, e.g., 1 and 100 GHz, and radio frequency (RF) filters, which operate at the frequencies between, e.g., 20 kHz and 300 GHz.

Microwave and RF filters are widely used in the field of communications to discriminate between wanted and unwanted signal frequencies. In an example filtering application, an RF front end employs a transmit filter that receives a signal outputted from a power amplifier that is to be wirelessly transmitted via an antenna. However, the power amplifier may produce out-of-band intermodulation products and harmonics. These components of the signal must be filtered to prevent leaking into the receiver and to satisfy regulatory requirements on out-of-band radiation. As such, the transmit filter has a high level of attenuation in the receive band and low attenuation in the transmit band.

The future of wireless systems will continue to trend toward devices that are smaller and lighter. As such, there is a need for the miniaturization of RF and microwave filters. Current approaches have provided varying levels of miniaturization with modest results. Some examples of conventional filters include cavity filters, planar filters (including microstrip filters, printed circuit board (PCB) filters, suspended substrate stripline filters, etc.), surface acoustic wave (SAW) filters, periodic structure filters, superconducting filters, among others. Despite the progress made, there exists a need for improved filter designs.

BRIEF DESCRIPTION OF THE DRAWINGS

Various embodiments in accordance with the present disclosure will be described with reference to the drawings, in which.

DETAILED DESCRIPTION

Figure 1A:
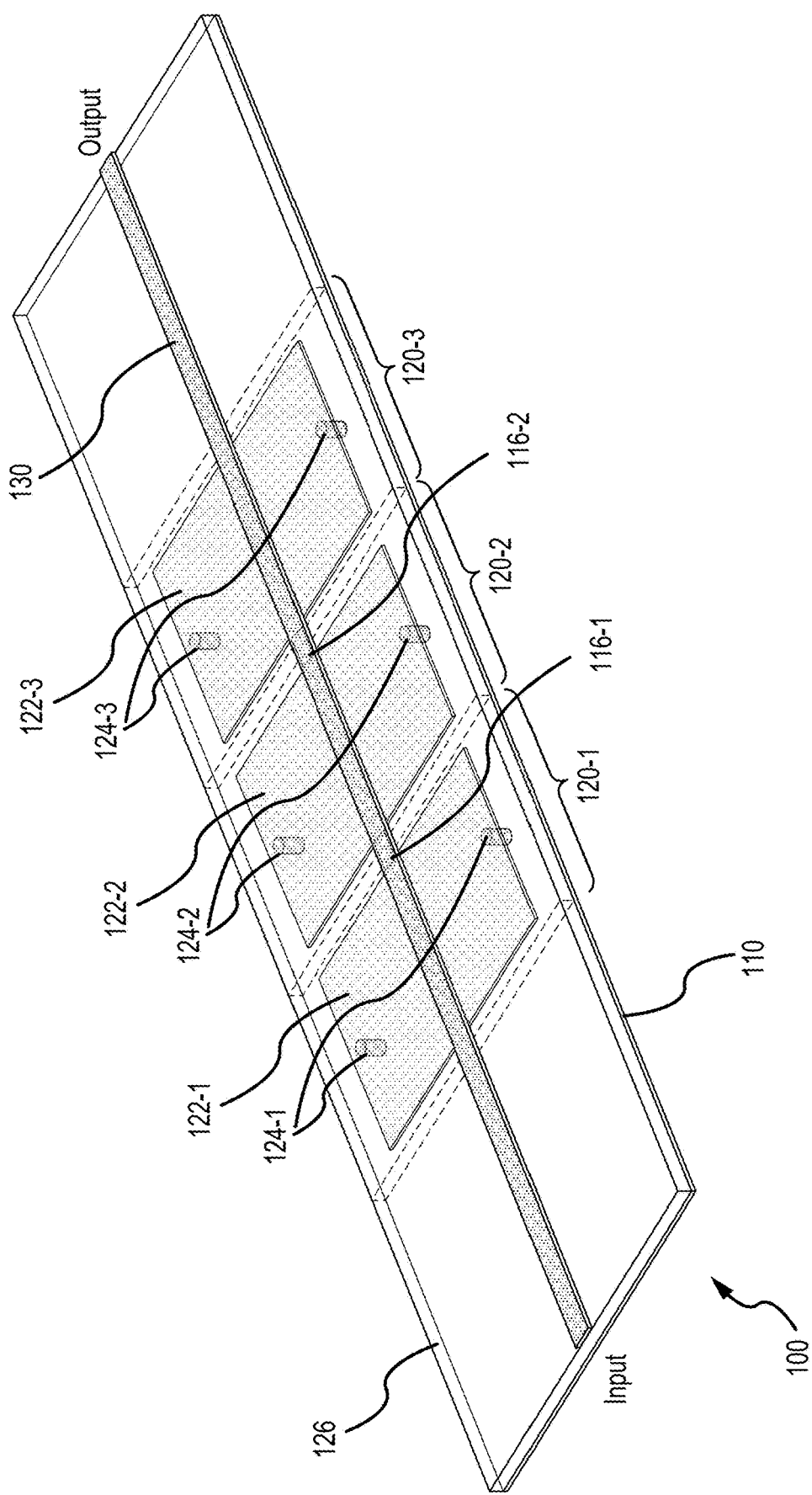
FIGS. 1A and 1B illustrate example perspective and cross section views of a filter, respectively.

Radio frequency (RF) and microwave filters are electronic filters with two ports (input port and output port) that can operate anywhere between 20 kHz and 300 GHz. Typically, electronic filters are designed to allow signals with desired frequencies to pass through while stopping signals with undesired frequencies. The performance of a distributed filter is heavily dependent on the physical dimensions of the conductive volumes and paths within the device, particularly at higher frequencies. As such, for WiFi signals in the 2.4 GHz and 5 GHz range, conventional filters are typically limited to using lumped components to achieve certain filter characteristics. Such conventional filters have the drawback of adding bills of material (BOM) cost.

Embodiments of the present invention relate to an electromagnetic bandgap (EBG)-based filter having a microstrip-like design that may be implemented on a printed circuit board (PCB). The filter may include a top conductor (or simply "conductor") that is separated from a ground plane by a dielectric layer or substrate. The filter may include multiple EBG structures, referred to as "unit cells", that are arranged in series along the top conductor and that are at least partially encapsulated by the dielectric layer. The unit cells may each include a planar structure that is disposed between the top conductor and the ground plane. The planar structures of neighboring unit cells may not be directly coupled to each other, but may include vias that connect the planar structures to the ground plane. Adjusting the physical dimensions of the planar structures, the vias, and the top conductor can modify several filter parameters, such as the stopband rejection, the rejection level, the cut-off frequency, the roll-off, the bandwidth, the passband ripple, etc.

The top conductor may overlie a center portion of each of the planar structures that separates a left side and a right side of each of the planar structures. The left side of each planar structure may be connected to the ground plane by a left via and the right side of each planar structure may be connected to the ground plane by a right via. The spacing between left and right vias can increase or decrease the effective inductance of each unit cell, and accordingly lower or raise the filter's cutoff frequency. For example, a maximum inductance and minimum cutoff frequency can be achieved by positioning the left and right vias at a furthest distance from each other, e.g., in opposite corners of the planar structures.

The top conductor may include one or more inter-cell paths that extend between portions of the top conductor that overlie the planar structures of neighboring unit cells. In some embodiments, the inter-cell paths may be linear and extend directly between the portions of the top conductor that overlie the planar structures. In some embodiments, the inter-cell paths may be non-linear and may include one or more turns or bends, thereby increasing the effective electrical length between unit cells without increasing the overall dimensions of the filter, allowing further miniaturization of the filter. In some instances, increasing the electrical length can result in a flatter in-band ripple.

In accordance with the described embodiments, the top conductor, the inter-cell paths, the ground plane, the planar structures, and the vias may be composed of one or more of a wide range of conductive materials such as copper, aluminum, silver, and other metals. In accordance with the described embodiments, the dielectric layer may be composed of one or more of a wide range of non-conductive materials (electrical insulators) or dielectric materials, such as polytetrafluoroethylene (PTFE), FR-4, FR-1, CEM-1, CEM-3, alumina, among other possibilities.

As used herein, a component may be considered to be "electrically conductive" if the component is composed of a conductive material and/or direct current (DC) (or DC electric current) is capable of flowing through the component. Furthermore, as used herein, a component may be considered to be "electrically insulating" if the component is not composed of a conductive material (e.g., is composed of an insulator) and/or DC electric current is incapable of flowing through the component.

Furthermore, as used herein, two components that are electrically conductive may be considered to be "conductively connected" to each other if DC electric current is capable of flowing between the two components, either directly between the first component and the second component or via a third component that is physically connected to each of the two components that is also electrically conductive.

Furthermore, as used herein, two components that are electrically conductive may be considered to be "conductively disconnected" from each other if DC electric current is incapable of flowing between the two components directly between the first component and the second component and if no third component exists that is physically connected to each of the two components that is also electrically conductive.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiments being described.

The figures herein follow a numbering convention in which the first digit or digits correspond to the figure number and the remaining digits identify an element or component in the figure. Similar elements or components between different figures may be identified by the use of similar digits. For example, 130 may reference element "30" in FIG. 1A, and a similar element may be referenced as 230 in FIG. 2. As will be appreciated, elements shown in the various embodiments herein can be added, exchanged, and eliminated so as to provide a number of additional embodiments of the present disclosure. In addition, the proportion and the relative scale of the elements provided in the figures are intended to illustrate certain embodiments of the present disclosure and should not be taken in a limiting sense.

Figure 1B:
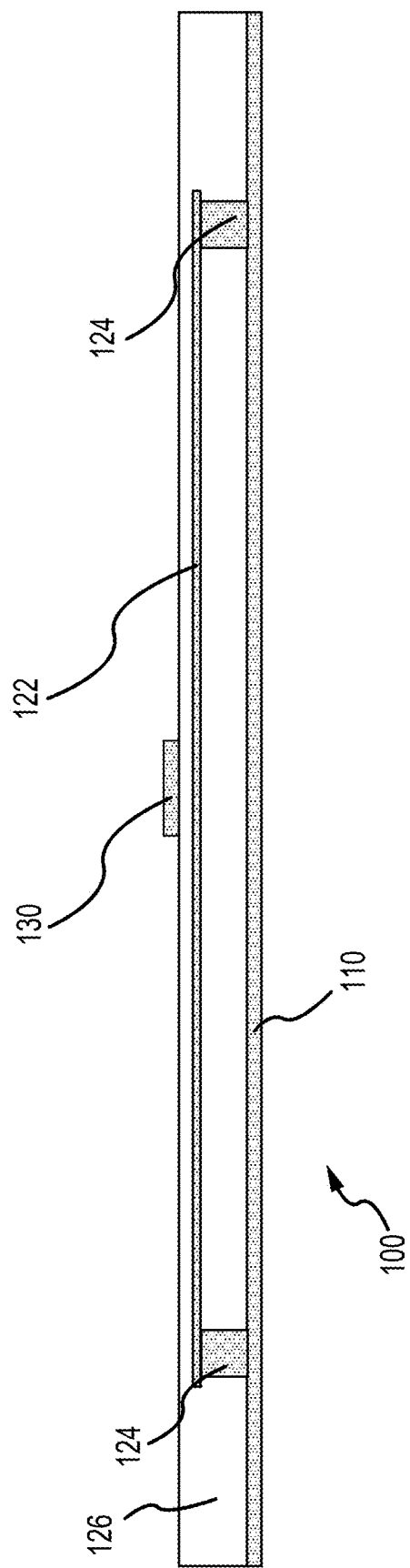

FIGS. 1A and 1B illustrate example perspective and cross section views of a filter 100, respectively, in accordance with some embodiments of the present disclosure. Filter 100 may be an RF filter or microwave filter and may be suitable for receiving and outputting signals (such as electric currents or voltages) having an oscillation rate anywhere between 20 kHz and 300 GHz. For example, filter 100 may receive, filter, and output WiFi signals at 2.4 GHz, 5 GHz, 6 GHz, among other possibilities. As another example, filter 100 may receive, filter, and output Bluetooth signals at 2.4 GHz. In some examples, filter 100 may be fabricated on a multi-layer PCB, such as a 3 or 4 layer PCB.

Filter 100 may include a top conductor 130 and a ground plane 110. Top conductor 130 may overlie ground plane 110 and may be separated from ground plane 110 by a dielectric layer 126 having a particular height. Top conductor 130 may have the geometry of a microstrip line, having a width greater than its height, and a length much greater than both its width and height. Top conductor 130 may have an input and an output as shown in FIG. 1A. The input and output of top conductor 130 may also represent the input and output of filter 100. Each of top conductor 130 and ground plane 110 may be electrically conductive, and top conductor 130 may be conductively disconnected from ground plane 110. Dielectric layer 126 may be electrically insulating. While a single dielectric layer 126 is illustrated, multiple dielectric layers may be employed, such as when filter 100 is fabricated on a multilayer PCB.

Filter 100 may further include a set of unit cells 120 (such as three unit cells) arranged in series. Each of unit cells 120 may include a planar structure 122 and a pair of vias 124. Each of planar structures 122 may be disposed between top conductor 130 and ground plane 110, and each of planar structures 122 may be connected to ground plane 110 through its respective pair of vias 124. Vias 124 may be cylindrical in shape or may have a different base shape other than a circle (e.g., square, rectangle, oblong, n-sided polygon, etc.). Each of planar structures 122 and vias 124 may be electrically conductive. As such, planar structures 122, vias 124, and ground plane 110 may be conductively connected to each other but may be conductively disconnected from top conductor 130. While the illustrated example shows three unit cells, it is to be understood that in some embodiments filter 100 may include a single unit cell, two unit cells, four unit cells, eight unit cells, or any number of unit cells.

In some examples, unit cells 120 may be arranged in series along top conductor 130 such that top conductor 130 overlies each of planar structures 122 of unit cells 120. In some examples, top conductor 130 may overlie a center portion or center strip of planar structures 122, separating a first side of planar structures 122 from a second side of planar structures 122. Planar structures 122 may be centered with respect to top conductor 130 such that the first and second sides of planar structures 122 are roughly equal. In some examples, each pair of vias 124 may include a first via connected to the first side and a second via connected to the second side of each of planar structures 122. In the illustrated example, vias 124 are connected near the center of the outer edges of planar structures 122. However, in other examples, vias 124 may be connected elsewhere along planar structures 122, such as near the centers of the first sides and second sides, near the corners (e.g., opposite corners) of the first sides and second sides, among other possibilities. In various examples, each of unit cells 120 may include a single via, a pair of vias (as illustrated), three vias, four vias, etc.

Top conductor 130 may include one or more inter-cell paths 116 that correspond to the portions of top conductor 130 that do not overlie planar structures 122 and are in between the portions of top conductor 130 that do overlie planar structures 122. In the illustrated example, top conductor 130 includes a first inter-cell path 116-1 between first planar structure 122-1 of first unit cell 120-1 and second planar structure 122-2 of second unit cell 120-2, and also a second inter-cell path 116-2 between second planar structure 122-2 and third planar structure 122-3 of third unit cell 120-3. While inter-cell paths 116 are linear in the illustrated example, in some examples inter-cell paths 116 may be non-linear and may include one or more bends or turns, increasing the electrical length of top conductor 130.

Various physical dimensions may be used for filter 100 to achieve different performance characteristics. In one particular embodiment, top conductor may have a width of 0.4 mm and a length of 15 mm. In one particular embodiment, ground plane 110 and dielectric layer 126 may have widths of 6.5 mm. In one particular embodiment, each of planar structures 122 may have a width of 5 mm and a length of 3 mm. In one particular embodiment, each of inter-cell paths 116 may have a width of 0.4 mm and a length of 0.5 mm.

Figure 2:
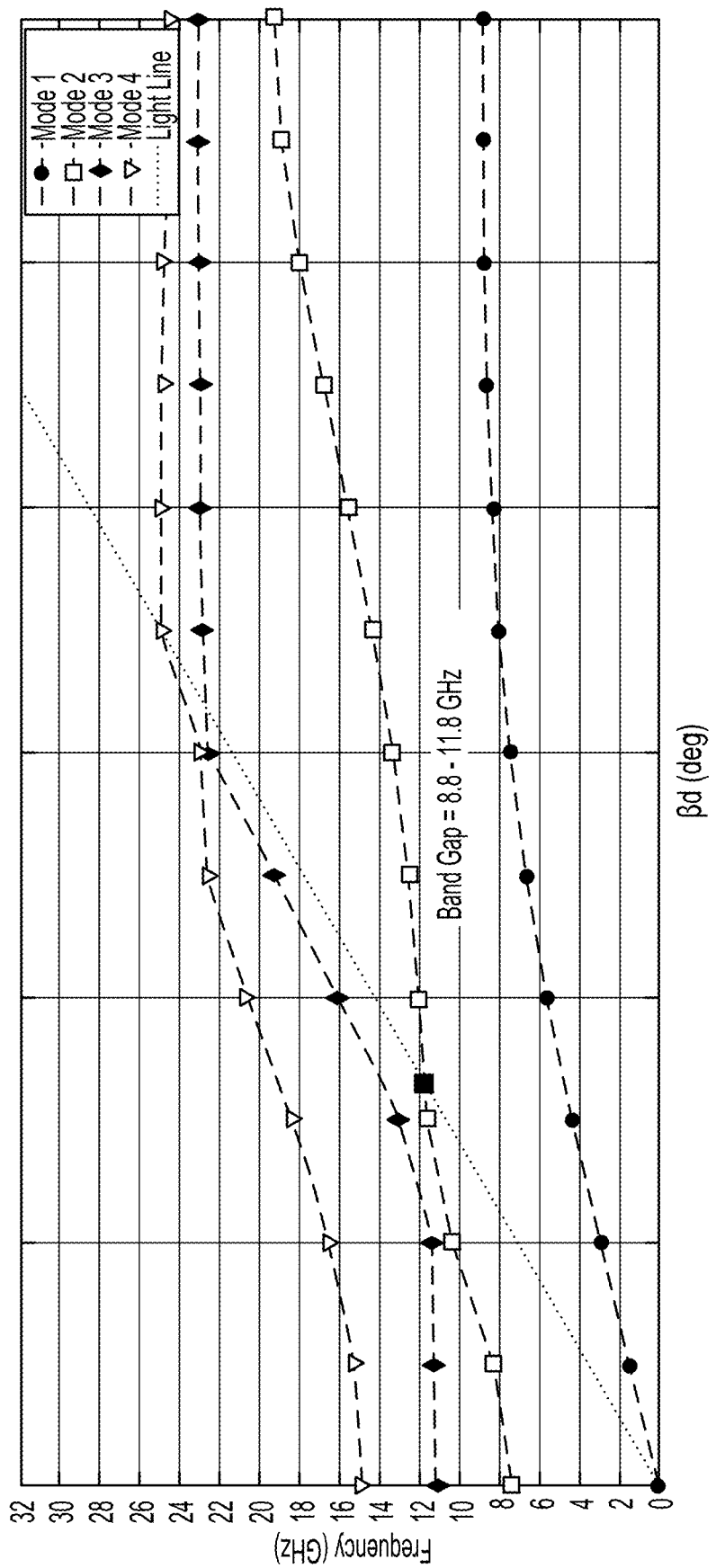
FIG. 2 illustrates an example simulated dispersion diagram for the filter illustrated in FIGS. 1A and 1B.

FIG. 2 illustrates an example simulated dispersion diagram for filter 100 illustrated in FIGS. 1A and 1B, in accordance with some embodiments of the present disclosure. Different lines in the dispersion diagram represent different modes of electromagnetic waves that may propagate within filter 100. It can be observed that there are some sections of the frequencies where the waves do not propagate. For example, the gap between Mode 1 and Mode 2 represents a band gap between 8.8 to 11.8 GHz. Any modes on the left side of the light line (indicated by the dotted line) are not propagating modes.

Figure 3:
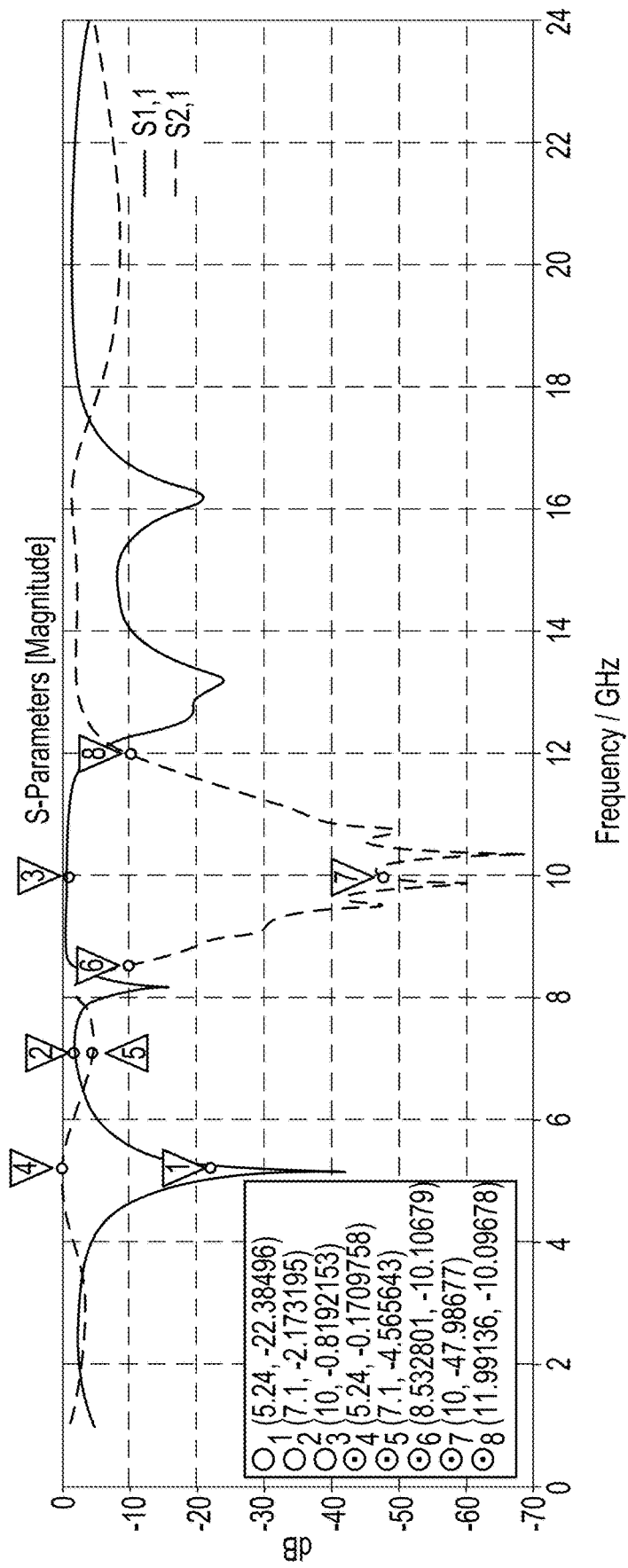
FIG. 3 illustrates example simulated S-parameters for the filter illustrated in FIGS. 1A and 1B.

FIG. 3 illustrates example simulated S-parameters for filter 100 illustrated in FIGS. 1A and 1B, in accordance with some embodiments of the present disclosure. The illustrated S-parameters include S1,1 and S2,1 parameters between 1 and 24 GHz. The S2,1 parameters show significant attenuation at the band gap (stopband) between 8.8 to 11.8 GHz, allowing filter 100 to reject signals in that frequency range while allowing passage of signals at other frequency ranges.

Figure 4:
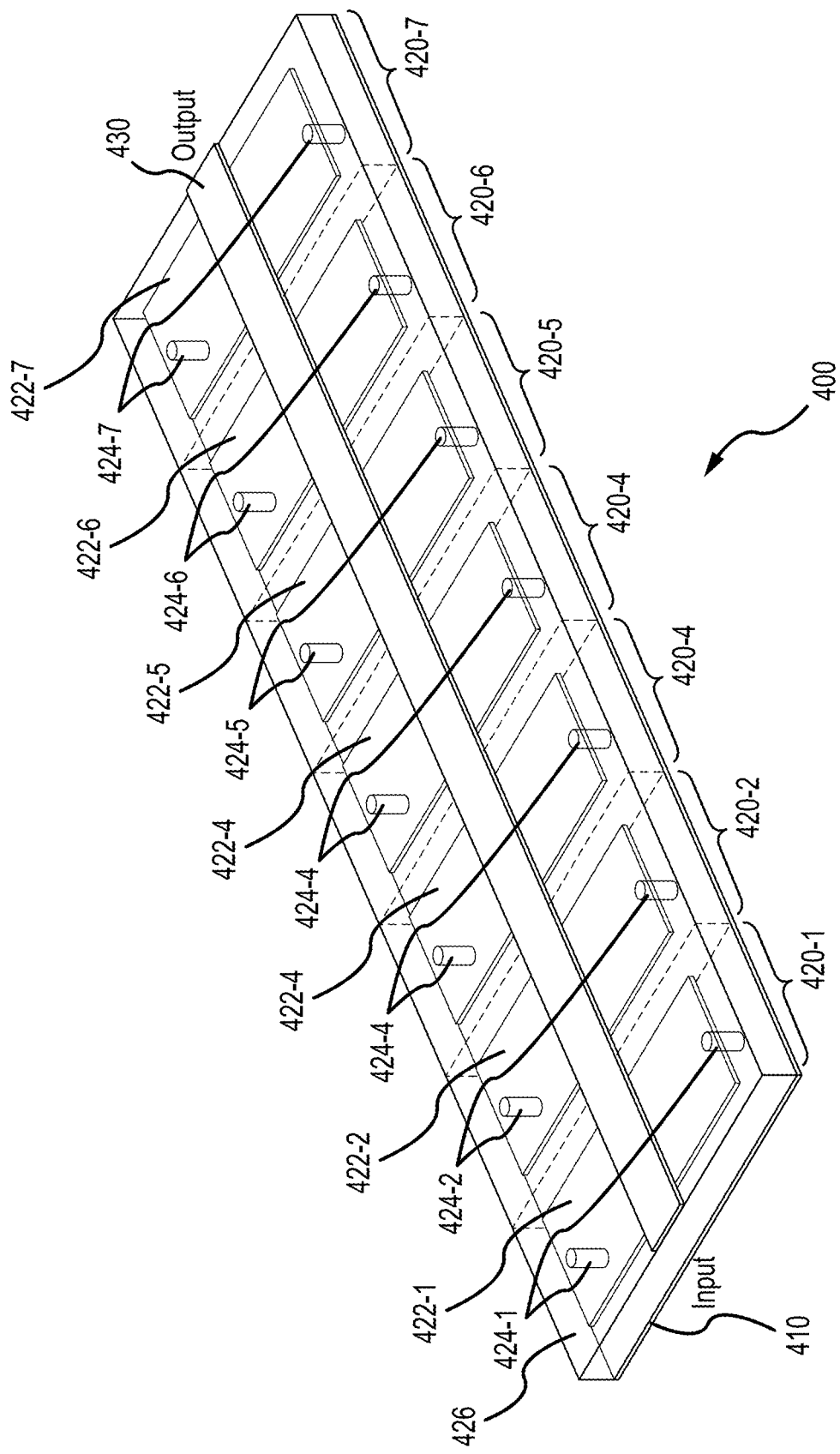
FIG. 4 illustrates an example perspective view of a filter.

FIG. 4 illustrates an example perspective view of a filter 400, in accordance with some embodiments of the present disclosure. Similar to filter 100, filter 400 may be an RF filter or microwave filter and may be suitable for operation at RF and microwave frequencies. Filter 400 may include a top conductor 430 that overlies a ground plane 410 and is separated from ground plane 410 by a dielectric layer 426 having a particular height. Top conductor 430 may have the geometry of a microstrip line, having a width greater than its height, and a length much greater than both its width and height. Top conductor 430 may have an input and an output as shown in FIG. 4. The input and output of top conductor 430 may also represent the input and output of filter 400. Each of top conductor 430 and ground plane 410 may be electrically conductive, and top conductor 430 may be conductively disconnected from ground plane 410. Dielectric layer 426 may be electrically insulating.

Filter 400 may include a set of unit cells 420 arranged in series. In the illustrated example, filter 400 includes seven unit cells 420, including a first unit cell 420-1, a second unit cell 420-2, a third unit cell 420-3, a fourth unit cell 420-4, a fifth unit cell 420-5, a sixth unit cell 420-6, and a seventh unit cell 420-7. Each of unit cells 420 may include a planar structure 422 and a pair of vias 424. Each of planar structures 422 may be disposed between top conductor 430 and ground plane 410, and each of planar structures 422 may be connected to ground plane 410 through its respective pair of vias 424. Each of planar structures 422 and vias 424 may be electrically conductive. As such, planar structures 422, vias 424, and ground plane 410 may be conductively connected to each other but may be conductively disconnected from top conductor 430.

In some examples, unit cells 420 may be arranged in series along top conductor 430 such that top conductor 430 overlies each of planar structures 422 of unit cells 420. In some examples, top conductor 430 may overlie a center portion or center strip of planar structures 422, separating a first side of planar structures 422 from a second side of planar structures 422. Planar structures 422 may be centered with respect to top conductor 430 such that the first and second sides of planar structures 422 are roughly equal. In some examples, each pair of vias 424 may include a first via connected to a first side and a second via connected to a second side of each of planar structures 422. In the illustrated example, vias 424 are connected near the center of the outer edges of planar structures 422.

In the illustrated example, top conductor 430 includes six inter-cell paths that correspond to the portions of top conductor 430 that do not overlie planar structures 422 and are in between the portions of top conductor 430 that do overlie planar structures 422. While the inter-cell paths are linear in the illustrated example, in some examples the inter-cell paths may be non-linear and may include one or more bends or turns, increasing the electrical length of top conductor 430.

Figure 5:
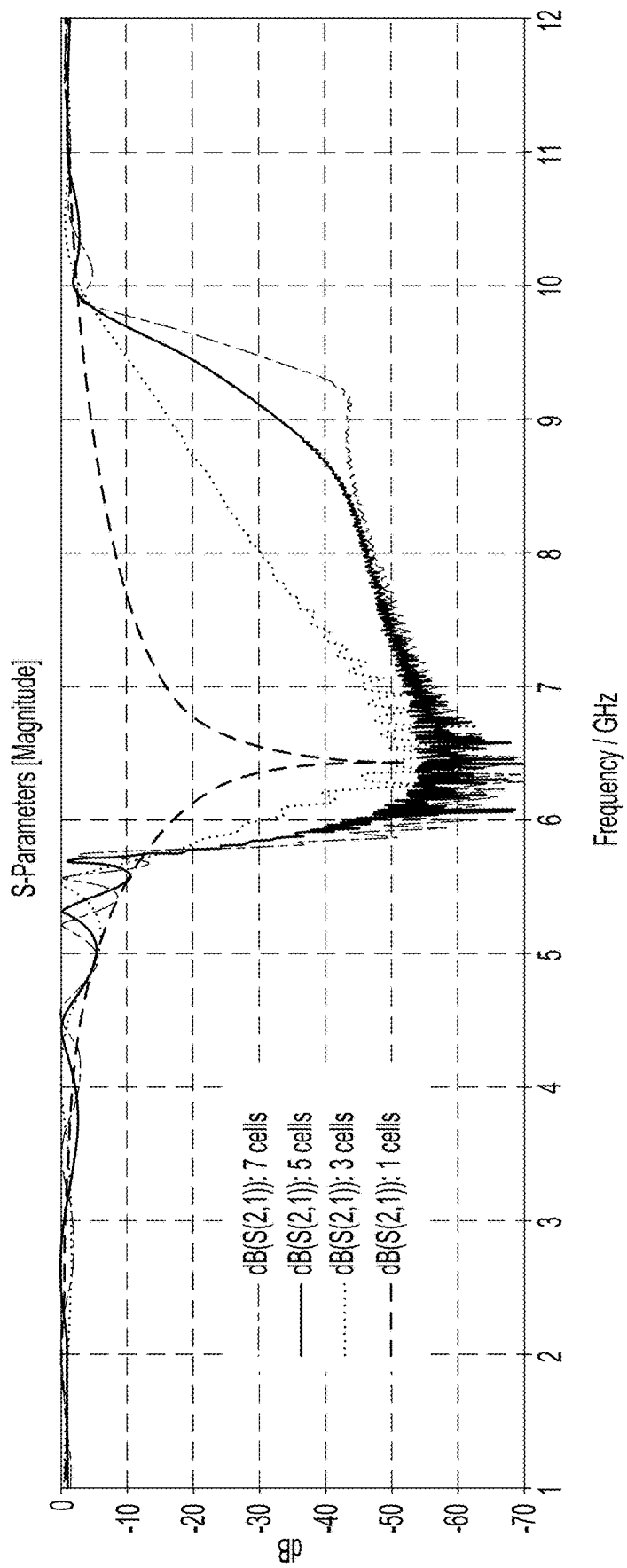
FIG. 5 illustrates example simulated S-parameters for the filter illustrated in FIG. 4 with various numbers of unit cells.

FIG. 5 illustrates example simulated S-parameters for filter 400 illustrated in FIG. 4 with various numbers of unit cells, in accordance with some embodiments of the present disclosure. The illustrated S-parameters include S2,1 parameters between 1 and 12 GHz. It can be observed that as the number of unit cells is increased from one to seven, the stopband widens allowing for a wider range of frequencies to be attenuated. In some examples, increasing the number of unit cells presents a tradeoff between the stopband rejection and bandwidth of the filter versus the passband ripple and physical size of the filter.

Figure 6:
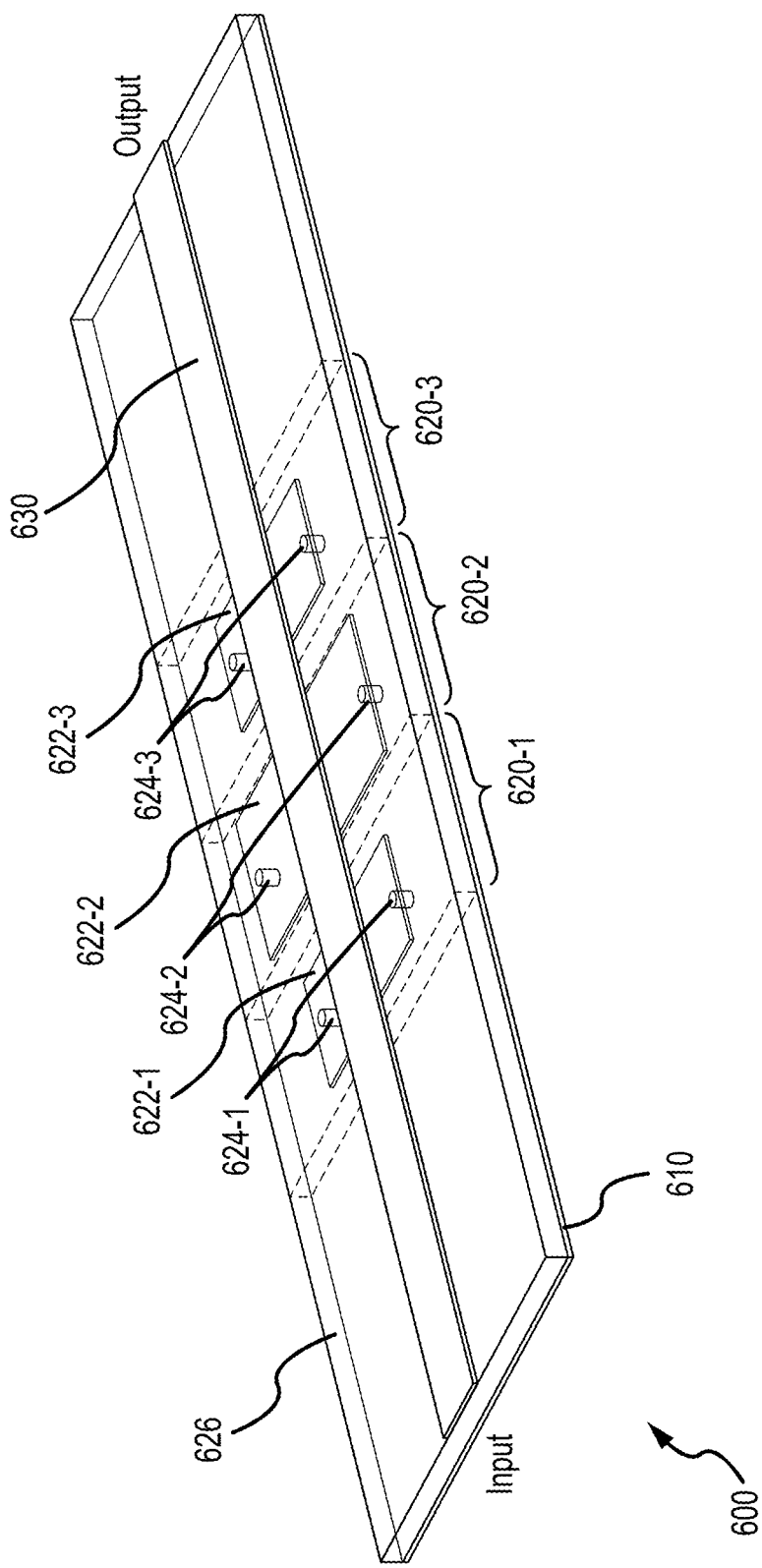
FIG. 6 illustrates an example perspective view of a filter incorporating geometrical tapering.

FIG. 6 illustrates an example perspective view of a filter 600 incorporating geometrical tapering in two directions, in accordance with some embodiments of the present disclosure. Similar to filters 100 and 400, filter 600 may be an RF filter or microwave filter and may be suitable for operation at RF and microwave frequencies. Filter 600 may include a top conductor 630 that overlies a ground plane 610 and is separated from ground plane 610 by a dielectric layer 626 having a particular height. Top conductor 630 may have the geometry of a microstrip line, having a width greater than its height, and a length much greater than both its width and height. Top conductor 630 may have an input and an output as shown in FIG. 6. The input and output of top conductor 630 may also represent the input and output of filter 600. Each of top conductor 630 and ground plane 610 may be electrically conductive, and top conductor 630 may be conductively disconnected from ground plane 610. Dielectric layer 626 may be electrically insulating.

Filter 600 may include a set of unit cells 620 arranged in series. In the illustrated example, filter 600 includes three unit cells 620, including a first unit cell 620-1, a second unit cell 620-2, and a third unit cell 620-3. Each of unit cells 620 may include a planar structure 622 and a pair of vias 624. Each of planar structures 622 may be disposed between top conductor 630 and ground plane 610, and each of planar structures 622 may be connected to ground plane 610 through its respective pair of vias 624. In the illustrated example, unit cells 620 are geometrically tapered in two directions (in a symmetrical configuration), such that a width of planar structure 622-2 is greater than each of the widths of planar structures 662-1 and 622-3. In other examples, unit cells 620 may be tapered in only one direction. For example, the widths of planar structures 622 may be monotonically increasing or decreasing in a particular direction (e.g., planar structures 622 may have increasing widths from unit cells 620-1 to 620-2 to 620-3). Tapering the widths of unit cells 620 can improve the performance of filter 600 due to the tapering of the capacitance and inductance of each of unit cells 620. Such improved performance may include improved passband ripple and increased bandwidth as a tradeoff for roll-off.

Each of planar structures 622 and vias 624 may be electrically conductive. As such, planar structures 622, vias 624, and ground plane 610 may be conductively connected to each other but may be conductively disconnected from top conductor 630. In some examples, unit cells 620 may be arranged in series along top conductor 630 such that top conductor 630 overlies each of planar structures 622 of unit cells 620. In some examples, top conductor 630 may overlie a center portion or center strip of planar structures 622, separating a first side of planar structures 622 from a second side of planar structures 622. Planar structures 622 may be centered with respect to top conductor 630 such that the first and second sides of planar structures 622 are roughly equal. In some examples, each pair of vias 624 may include a first via connected to a first side and a second via connected to a second side of each of planar structures 622. In the illustrated example, vias 624 are connected near the center of the outer edges of planar structures 622.

In the illustrated example, top conductor 630 includes two inter-cell paths that correspond to the portions of top conductor 630 that do not overlie planar structures 622 and are in between the portions of top conductor 630 that do overlie planar structures 622. While the inter-cell paths are linear in the illustrated example, in some examples the inter-cell paths may be non-linear and may include one or more bends or turns, increasing the electrical length of top conductor 630.

Figure 7:
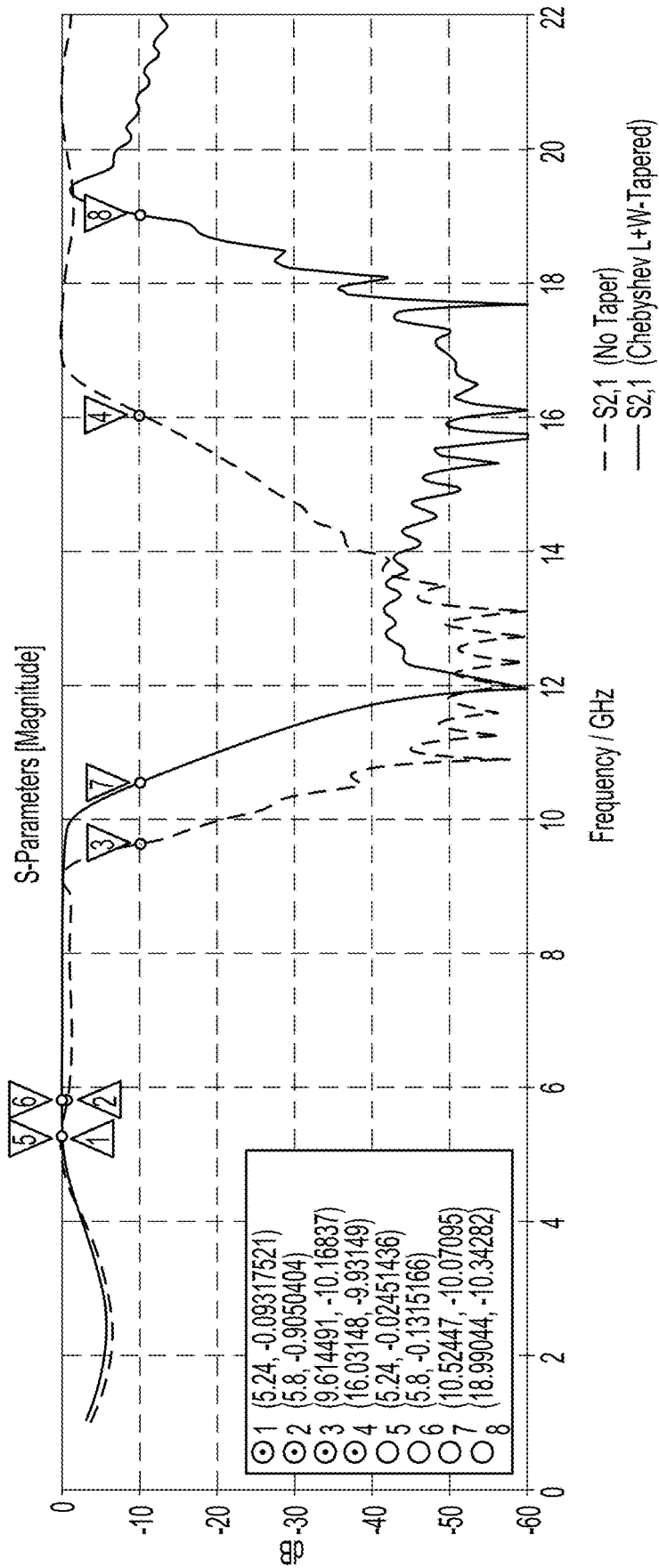
FIG. 7 illustrates example simulated S-parameters for the filter illustrated in FIG. 6 with and without geometrical tapering.

FIG. 7 illustrates example simulated S-parameters for filter 600 illustrated in FIG. 6 with and without geometrical tapering, in accordance with some embodiments of the present disclosure. The illustrated S-parameters include S2,1 parameters between 1 and 22 GHz. The dotted line corresponds to filter 600 with no tapering and the solid line corresponds to filter 600 with tapering (e.g., Chebyshev tapering where widths of the planar structures correspond to Chebyshev polynomials). It can be observed that the geometrical tapering can improve the flatness of the passband ripple and increase the bandwidth of the stopband, at the tradeoff of increased stopband ripple.

Figure 8:
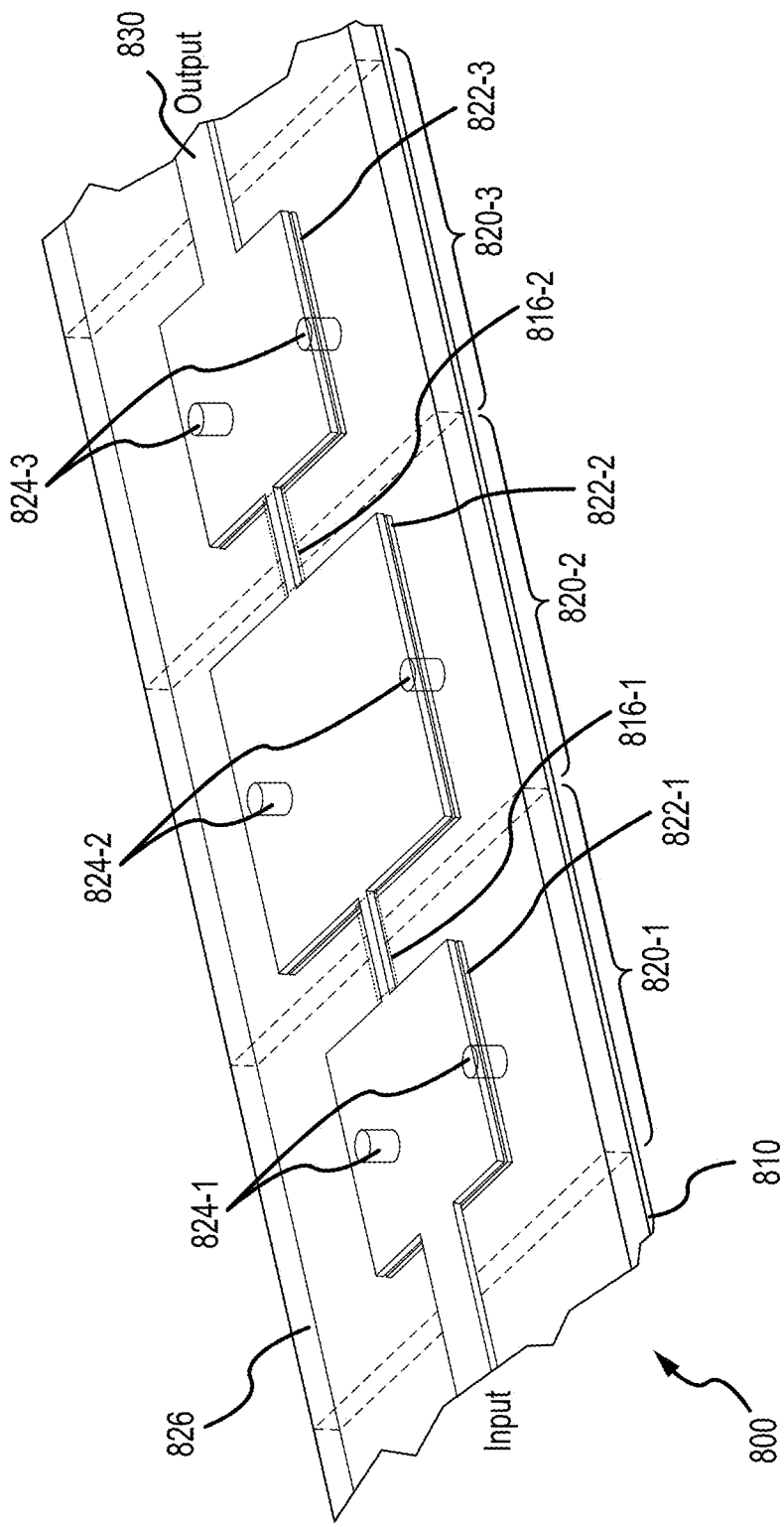
FIG. 8 illustrates an example perspective view of a filter incorporating geometrical tapering in two directions and conductor modulation.

FIG. 8 illustrates an example perspective view of a filter 800 incorporating tapering in two directions and conductor modulation, in accordance with some embodiments of the present disclosure. Similar to filters 100, 400, and 600, filter 800 may be an RF filter or microwave filter and may be suitable for operation at RF and microwave frequencies. Filter 800 may include a top conductor 830 that overlies a ground plane 810 and is separated from ground plane 810 by a dielectric layer 826 having a particular height. Top conductor 830 may have an input and an output as shown in FIG. 8. The input and output of top conductor 830 may also represent the input and output of filter 800. Each of top conductor 830 and ground plane 810 may be electrically conductive, and top conductor 830 may be conductively disconnected from ground plane 810. Dielectric layer 826 may be electrically insulating.

Filter 800 may include a set of unit cells 820 arranged in series. In the illustrated example, filter 800 includes three unit cells 820, including a first unit cell 820-1, a second unit cell 820-2, and a third unit cell 820-3. Each of unit cells 820 may include a planar structure 822 and a pair of vias 824. Each of planar structures 822 may be disposed between top conductor 830 and ground plane 810, and each of planar structures 822 may be connected to ground plane 810 through its respective pair of vias 824. In the illustrated example, unit cells 820 are geometrically tapered in two directions, such that a width of planar structure 822-2 is greater than each of the widths of planar structures 862-1 and 822-3. In other examples, unit cells 820 may be geometrically tapered in only one direction. For example, the widths of planar structures 822 may be monotonically increasing or decreasing in a particular direction (e.g., planar structures 822 may have increasing widths from unit cells 820-1 to 820-2 to 820-3).

Each of planar structures 822 and vias 824 may be electrically conductive. As such, planar structures 822, vias 824, and ground plane 810 may be conductively connected to each other but may be conductively disconnected from top conductor 830. In some examples, unit cells 820 may be arranged in series along top conductor 830 such that top conductor 830 overlies each of planar structures 822 of unit cells 820. In some examples, each pair of vias 824 may include a first via connected to a first side and a second via connected to a second side of each of planar structures 822. In the illustrated example, vias 824 are connected near the center of the outer edges of planar structures 822.

In the illustrated example, top conductor 830 is modulated such that top conductor 830 overlies an entirety of planar structures 822. In some examples, top conductor 830 may be modulated to substantially match the widths and lengths of each of planar structures 822. In the illustrated example, top conductor 830 includes two inter-cell paths 816 that correspond to the portions of top conductor 830 that do not overlie planar structures 822 and are in between the portions of top conductor 830 that do overlie planar structures 822. In the illustrated example, the widths of inter-cell paths 816 are less than the widths of top conductor 830 at the input and output. While the inter-cell paths are linear in the illustrated example, in some examples the inter-cell paths may be non-linear and may include one or more bends or turns, increasing the electrical length of top conductor 830.

Figure 9:
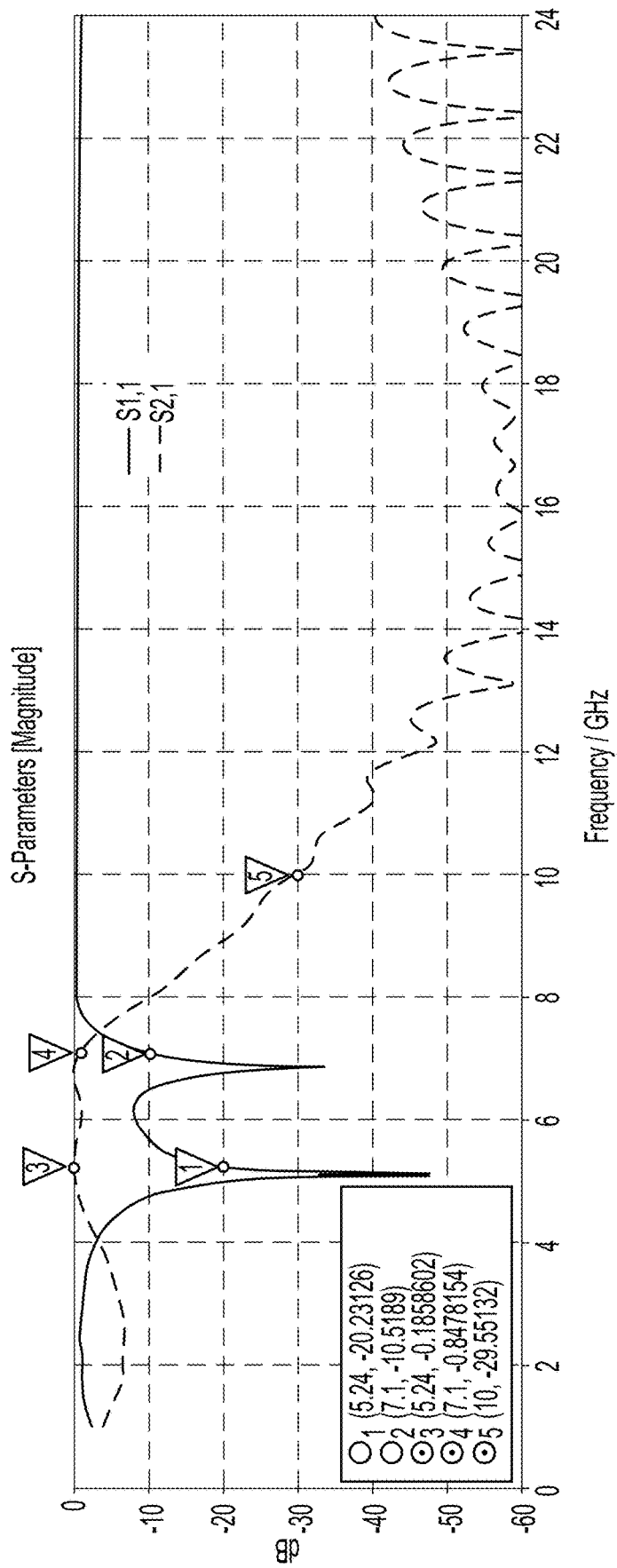
FIG. 9 illustrates example simulated S-parameters for the filter illustrated in FIG. 8.

FIG. 9 illustrates example simulated S-parameters for filter 800 illustrated in FIG. 8, in accordance with some embodiments of the present disclosure. The illustrated S-parameters include S1,1 and S2,1 parameters between 1 and 24 GHz. It can be observed that filter 800 in this configuration effectively behaves as a low pass filter. The illustrated S-parameters are achieved due to the geometrical modulation in multiple simultaneous layers creating more capacitance and inductance for the device. The added capacitance helps for miniaturization of the device by moving the cutoff frequency to a lower frequency, thereby increasing the filter's bandwidth.

Figure 10:
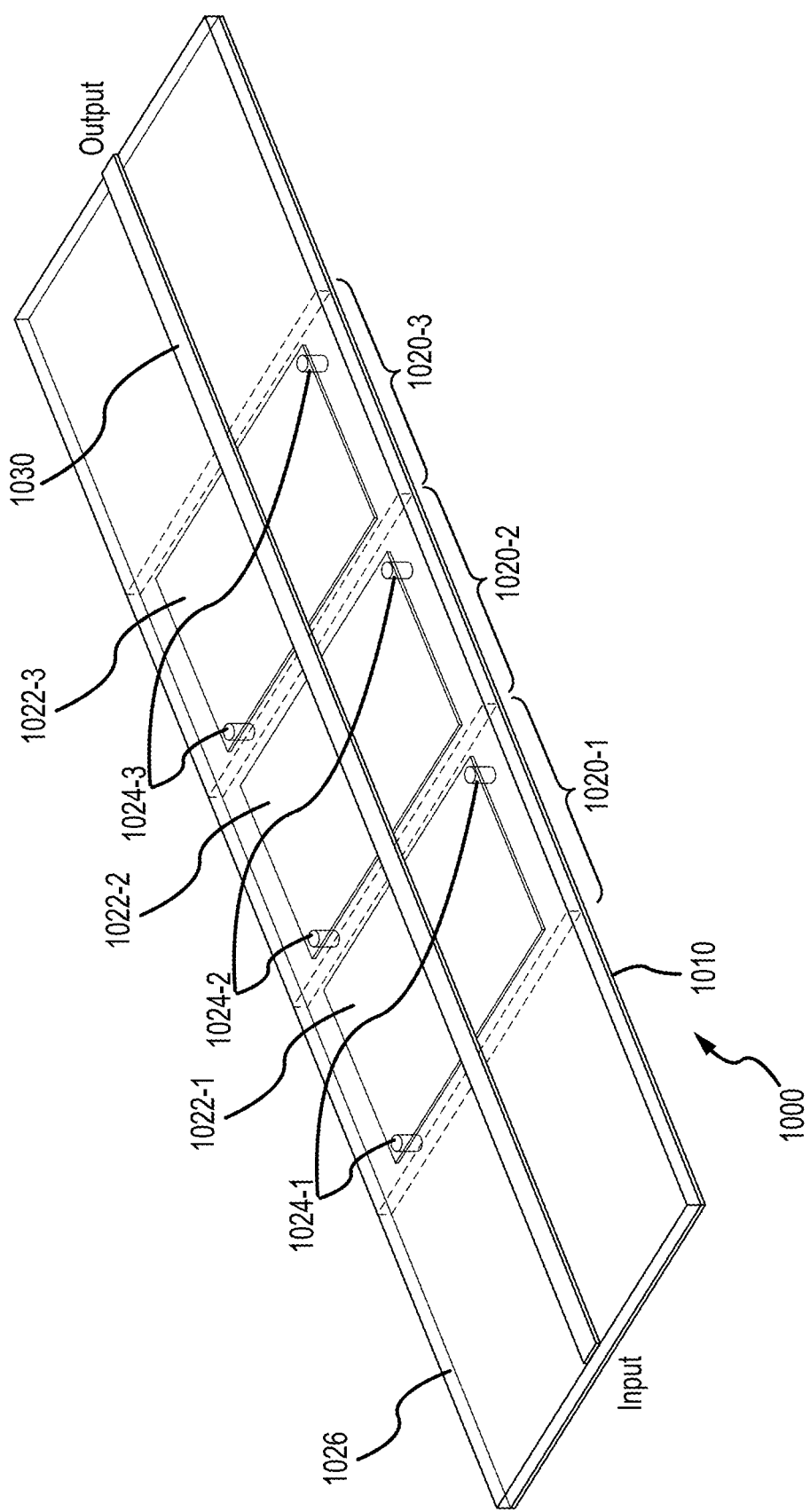
FIG. 10 illustrates an example perspective view of a filter incorporating diagonal vias.

FIG. 10 illustrates an example perspective view of a filter 1000 incorporating diagonal vias 1024, in accordance with some embodiments of the present disclosure. Similar to filters 100, 400, 600, and 800, filter 1000 may be an RF filter or microwave filter and may be suitable for operation at RF and microwave frequencies. Filter 1000 may include a top conductor 1030 that overlies a ground plane 1010 and is separated from ground plane 1010 by a dielectric layer 1026 having a particular height. Top conductor 1030 may have the geometry of a microstrip line, having a width greater than its height, and a length much greater than both its width and height. Top conductor 1030 may have an input and an output as shown in FIG. 10. The input and output of top conductor 1030 may also represent the input and output of filter 1000.

Each of top conductor 1030 and ground plane 1010 may be electrically conductive, and top conductor 1030 may be conductively disconnected from ground plane 1010. Dielectric layer 1026 may be electrically insulating.

Filter 1000 may include a set of unit cells 1020 arranged in series. In the illustrated example, filter 1000 includes three cells 1020, including a first unit cell 1020-1, a second unit cell 1020-2, and a third unit cell 1020-3. Each of unit cells 1020 may include a planar structure 1022 and a pair of vias 1024. Each of planar structures 1022 may be disposed between top conductor 1030 and ground plane 1010, and each of planar structures 1022 may be connected to ground plane 1010 through its respective pair of vias 1024. Each of planar structures 1022 and vias 1024 may be electrically conductive. As such, planar structures 1022, vias 1024, and ground plane 1010 may be conductively connected to each other but may be conductively disconnected from top conductor 1030.

In some examples, unit cells 1020 may be arranged in series along top conductor 1030 such that top conductor 1030 overlies each of planar structures 1022 of unit cells 1020. In some examples, top conductor 1030 may overlie a center portion or center strip of planar structures 1022, separating a first side of planar structures 1022 from a second side of planar structures 1022. Planar structures 1022 may be centered with respect to top conductor 1030 such that the first and second sides of planar structures 1022 are roughly equal. In some examples, each pair of vias 1024 may include a first via connected to a first side and a second via connected to a second side of each of planar structures 1022. In the illustrated example, vias 1024 are connected near opposite corners of planar structures 1022, thereby increasing the distance between the two vias for each pair and increasing the inductance of the filter.

In the illustrated example, top conductor 1030 includes two inter-cell paths that correspond to the portions of top conductor 1030 that do not overlie planar structures 1022 and are in between the portions of top conductor 1030 that do overlie planar structures 1022. While the inter-cell paths are linear in the illustrated example, in some examples the inter-cell paths may be non-linear and may include one or more bends or turns, increasing the electrical length of top conductor 1030.

Figure 11:
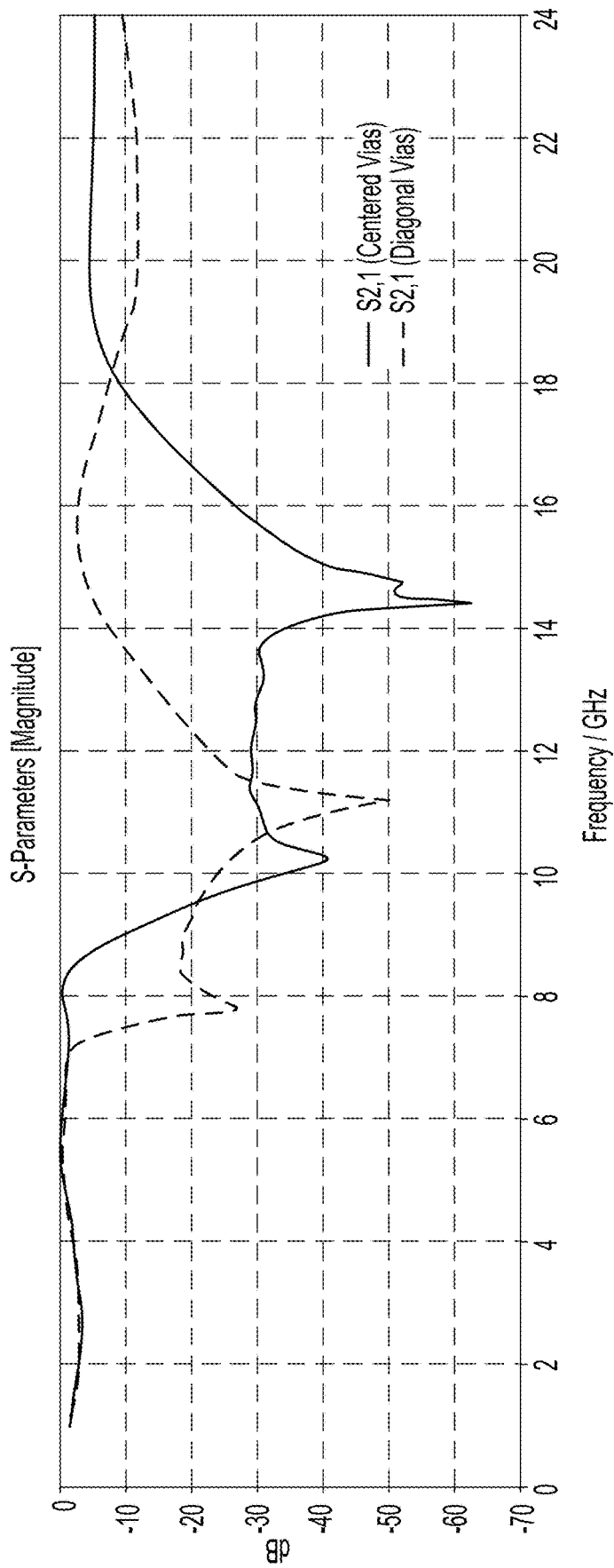
FIG. 11 illustrates example simulated S-parameters for the filter illustrated in FIG. 10 with centered vias and diagonal vias.

FIG. 11 illustrates example simulated S-parameters for filter 1000 illustrated in FIG. 10 with centered vias and diagonal vias, in accordance with some embodiments of the present disclosure. The illustrated S-parameters include S2,1 parameters between 1 and 24 GHz. It can be observed that the start frequency of the stopband decreases from approximately 8 GHz to 7 GHz. Decreasing the cutoff frequency can be achieved without increasing the filter's effective size, allowing for miniaturization of the device. The illustrated S-parameters are achieved due to the diagonal vias increasing the inductance of the filter.

Figure 12:
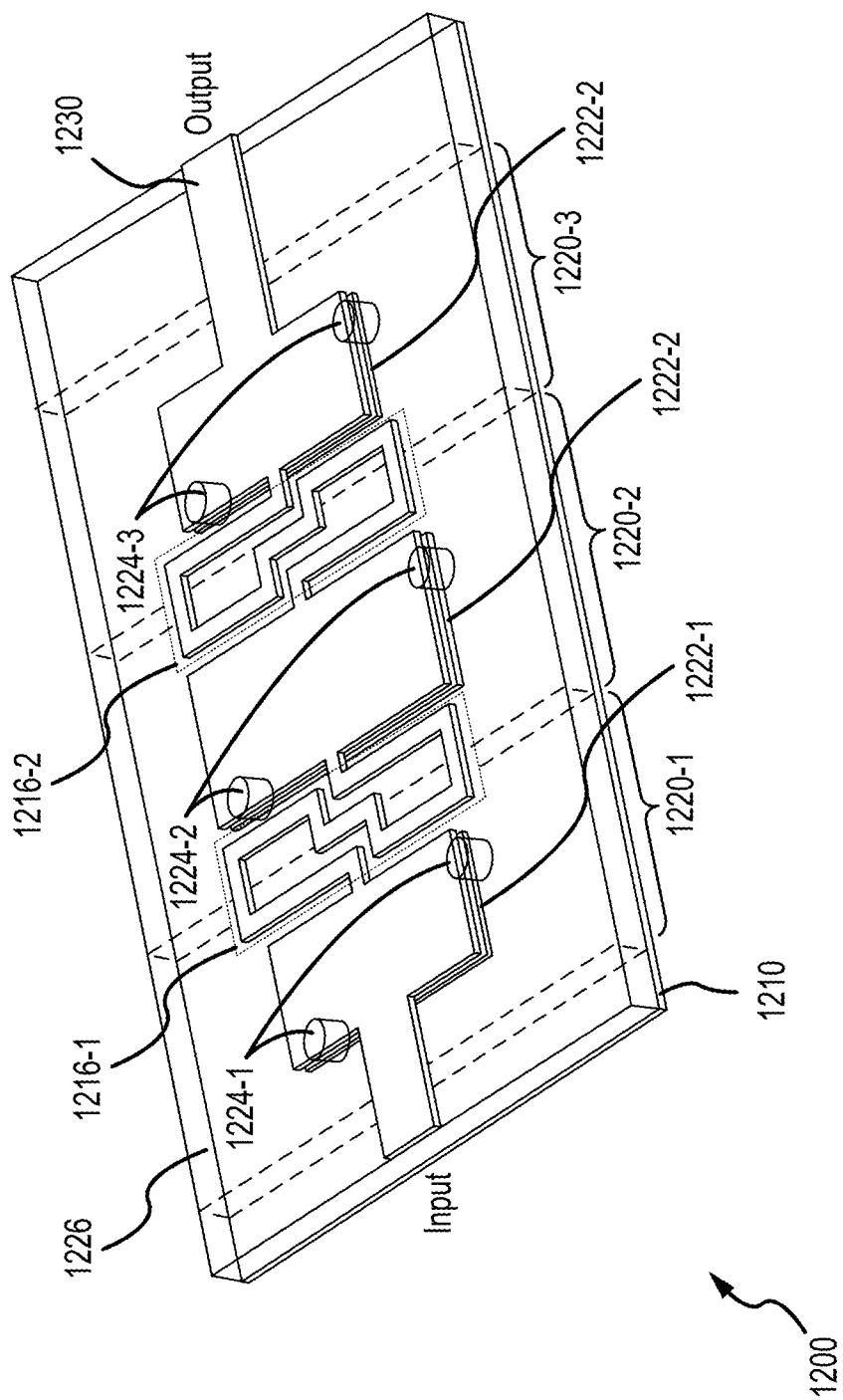
FIG. 12 illustrates an example perspective view of a filter incorporating geometrical tapering in two directions, conductor modulation, and non-linear inter-cell paths.

FIG. 12 illustrates an example perspective view of a filter 1200 incorporating geometrical tapering in two directions, conductor modulation, and non-linear inter-cell paths, in accordance with some embodiments of the present disclosure. Similar to filters 100, 400, 600, 800, and 1000, filter 1200 may be an RF filter or microwave filter and may be suitable for operation at RF and microwave frequencies. Filter 1200 may include a top conductor 1230 that overlies a ground plane 1210 and is separated from ground plane 1210 by a dielectric layer 1226 having a particular height. Top conductor 1230 may have an input and an output as shown in FIG. 12. The input and output of top conductor 1230 may also represent the input and output of filter 1200.

Each of top conductor 1230 and ground plane 1210 may be electrically conductive, and top conductor 1230 may be conductively disconnected from ground plane 1210. Dielectric layer 1226 may be electrically insulating.

Filter 1200 may include a set of unit cells 1220 arranged in series. In the illustrated example, filter 1200 includes three unit cells 1220, including a first unit cell 1220-1, a second unit cell 1220-2, and a third unit cell 1220-3. Each of unit cells 1220 may include a planar structure 1222 and a pair of vias 1224. Each of planar structures 1222 may be disposed between top conductor 1230 and ground plane 1210, and each of planar structures 1222 may be connected to ground plane 1210 through its respective pair of vias 1224. In the illustrated example, unit cells 1220 are geometrically tapered in two directions, such that a width of planar structure 1222-2 is greater than each of the widths of planar structures 1262-1 and 1222-3. In other examples, unit cells 1220 may be geometrically tapered in only one direction. For example, the widths of planar structures 1222 may be monotonically increasing or decreasing in a particular direction (e.g., planar structures 1222 may have increasing widths from unit cells 1220-1 to 1220-2 to 1220-3).

Each of planar structures 1222 and vias 1224 may be electrically conductive. As such, planar structures 1222, vias 1224, and ground plane 1210 may be conductively connected to each other but may be conductively disconnected from top conductor 1230. In some examples, unit cells 1220 may be arranged in series along top conductor 1230 such that top conductor 1230 overlies each of planar structures 1222 of unit cells 1220. In some examples, each pair of vias 1224 may include a first via connected to a first side and a second via connected to a second side of each of planar structures 1222. In the illustrated example, vias 1224 are connected near opposite corners of planar structures 1222, thereby increasing the distance between the two vias for each pair and increasing the inductance of the filter.

In the illustrated example, top conductor 1230 is modulated such that top conductor 1230 overlies an entirety of planar structures 1222. In some examples, top conductor 1230 may be modulated to substantially match the widths and lengths of each of planar structures 1222. In the illustrated example, top conductor 1230 includes two inter-cell paths 1216 that correspond to the portions of top conductor 1230 that do not overlie planar structures 1222 and are in between the portions of top conductor 1230 that do overlie planar structures 1222. In the illustrated example, inter-cell paths 1216 are non-linear and include multiple turns or bends in a meandering configuration, increasing the electrical length of top conductor 1230. The non-linear inter-cell paths 1216 allow the cutoff frequency to be reduced without increasing the filter's effective size, allowing for miniaturization of the device.

Figure 13:
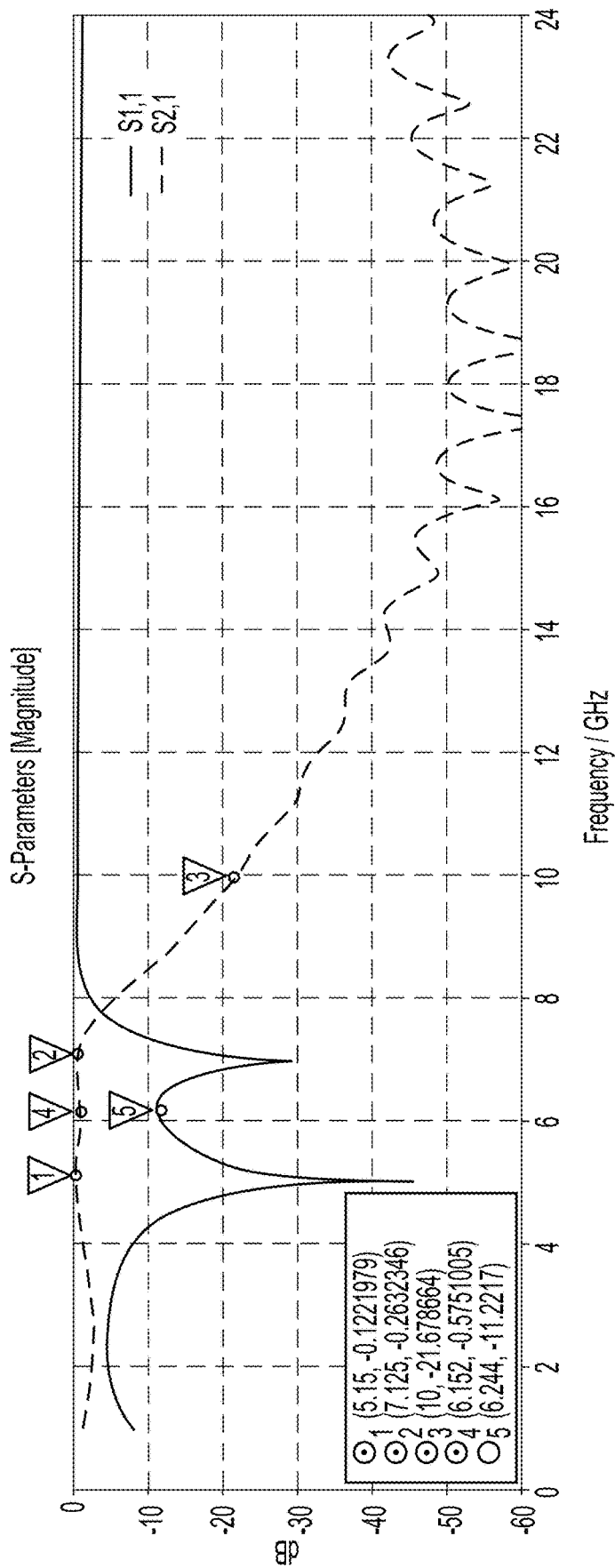
FIG. 13 illustrates example simulated S-parameters for the filter illustrated in FIG. 12.

FIG. 13 illustrates example simulated S-parameters for filter 1200 illustrated in FIG. 12, in accordance with some embodiments of the present disclosure. The illustrated S-parameters include S1,1 and S2,1 parameters between 1 and 24 GHz. The illustrated S-parameters show a smooth passband ripple and significant attenuation in the stopband.

Figure 14:
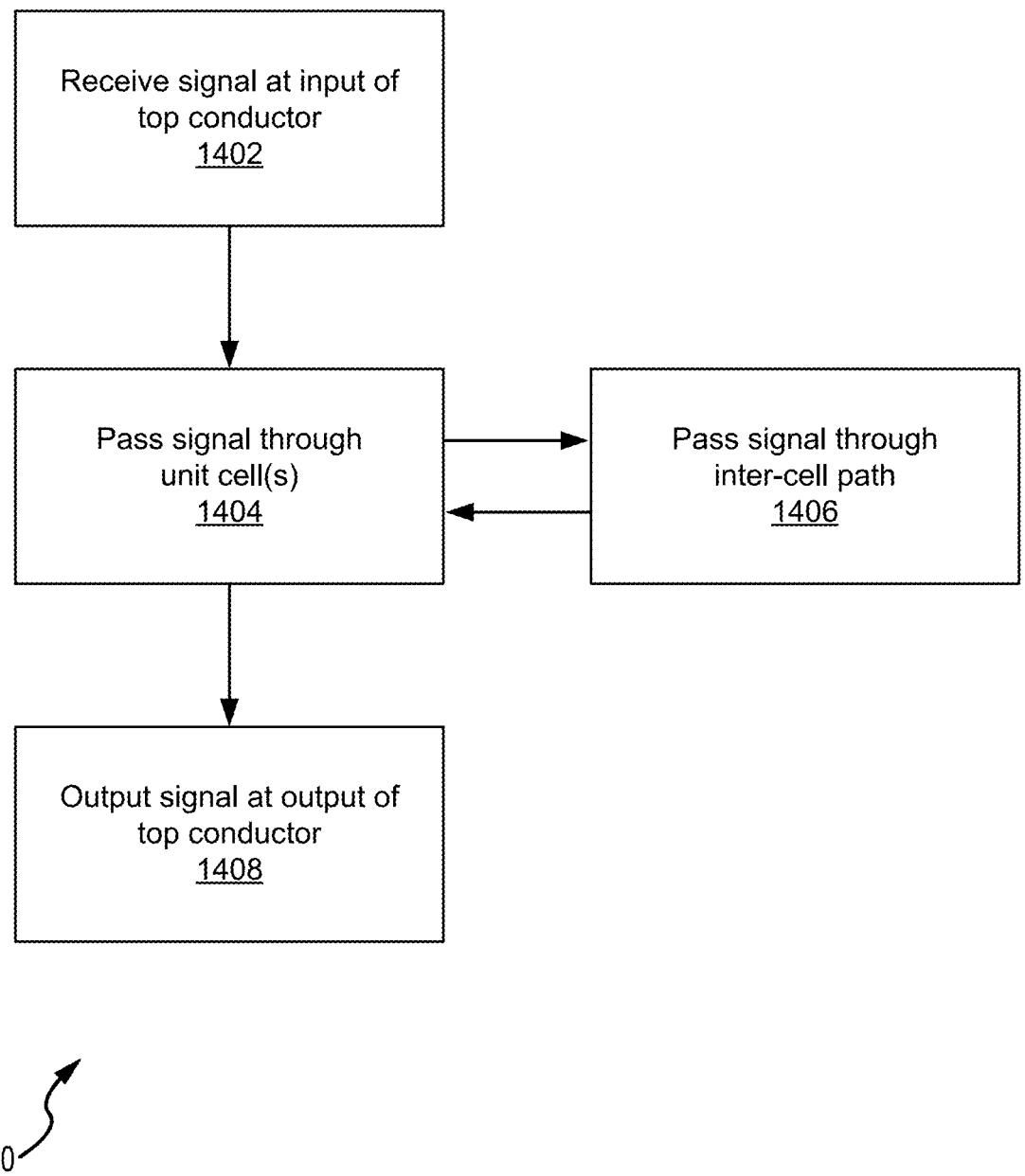
FIG. 14 illustrates an example method of filtering a signal using a filter.

FIG. 14 illustrates an example method 1400 of filtering a signal using a filter, in accordance with some embodiments of the present disclosure. The signal may be an RF signal or a microwave signal. The filter may be an RF filter or a microwave filter, and may correspond to any of filters 100, 400, 600, 800, 1000, and 1200 as described herein. At step 1402, the signal is received at an input of a top conductor. At step 1404, the signal is passed through a plurality of unit cells arranged in series along the top conductor. At step 1406, the signal is passed through at least one inter-cell path of the top conductor. At step 1408, the signal is outputted at an output of the top conductor. In some examples, method 1400 may further include attenuating the signal during one or more of the illustrated steps, such as during steps 1404 and 1406. In some examples, one or more steps of method 1400 may be omitted during performance of method 1400, and steps of method 1400 may be performed in any order and/or in parallel.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A method of filtering a signal, the method comprising:
    receiving the signal at an input of a top conductor, the top conductor overlying a ground plane;
    passing the signal through a plurality of unit cells arranged in series along the top conductor, wherein each of the plurality of unit cells includes:
        a planar structure disposed between the top conductor and the ground plane, wherein the planar structure is composed of a conductive material; and
        a pair of vias connecting the planar structure to the ground plane; and
    outputting the signal at an output of the top conductor
    wherein the plurality of unit cells are geometrically tapered in a first direction such that a width of a first unit cell of the plurality of unit cells is less than a width of a second unit cell of the plurality of unit cells, wherein the first unit cell neighbors the second unit cell.

2. The method of claim 1, wherein the pair of vias of a unit cell of the plurality of unit cells includes a first via connected to a first side of the planar structure and a second via connected to a second side of the planar structure.

3. The method of claim 2, wherein, for the unit cell, the top conductor overlies a center portion of the planar structure that separates the first side and the second side of the planar structure.

4. The method of claim 2, wherein, for the unit cell, the first via is connected near a center of a first outer edge on the first side of the planar structure, and the second via is connected near a center of a second outer edge on the second side of the planar structure.

5. The method of claim 1, further comprising:
    passing the signal through at least one inter-cell path of the top conductor, wherein the at least one inter-cell path is between portions of the top conductor that overlie neighboring cells of the plurality of unit cells, and wherein the at least one inter-cell path is non-linear.

6. An apparatus comprising:
    a ground plane;
    a top conductor overlying the ground plane, the top conductor having an input and an output for receiving and outputting signals, respectively; and
    a plurality of unit cells arranged in series along the top conductor, wherein each of the plurality of unit cells includes:
        a planar structure disposed between the top conductor and the ground plane, wherein the planar structure is composed of a conductive material; and
        a pair of vias connecting the planar structure to the ground plane;
    wherein the plurality of unit cells are geometrically tapered in a first direction such that a width of a first unit cell of the plurality of unit cells is less than a width of a second unit cell of the plurality of unit cells, wherein the first unit cell neighbors the second unit cell.

7. The apparatus of claim 6, further comprising:
    a dielectric layer disposed between the top conductor and the ground plane, wherein each of the plurality of unit cells is at least partially encapsulated by the dielectric layer.

8. The apparatus of claim 6, wherein the pair of vias of a unit cell of the plurality of unit cells includes a first via connected to a first side of the planar structure and a second via connected to a second side of the planar structure.

9. The apparatus of claim 8, wherein, for the unit cell, the top conductor overlies a center portion of the planar structure that separates the first side and the second side of the planar structure.

10. The apparatus of claim 8, wherein, for the unit cell, the top conductor overlies an entirety of the planar structure.

11. The apparatus of claim 8, wherein, for the unit cell, the first via is connected near a center of a first outer edge on the first side of the planar structure, and the second via is connected near a center of a second outer edge on the second side of the planar structure.

12. The apparatus of claim 8, wherein, for the unit cell, the first via is connected near a first corner on the first side of the planar structure, and the second via is connected near a second corner on the second side of the planar structure.

13. The apparatus of claim 6, wherein the top conductor includes at least one inter-cell path between portions of the top conductor that overlie neighboring cells of the plurality of unit cells, and wherein the at least one inter-cell path is non-linear.

14. The apparatus of claim 6, wherein the plurality of unit cells are further geometrically tapered in a second direction such that a width of a third unit cell of the plurality of unit cells is less than the width of the second unit cell of the plurality of unit cells, wherein the third unit cell neighbors the second unit cell.

15. An apparatus comprising:
a ground plane;
a top conductor overlying the ground plane, the top conductor having an input and an output for receiving and outputting signals, respectively; and
a plurality of unit cells arranged in series along the top conductor, wherein each of the plurality of unit cells includes:
a planar structure disposed between the top conductor and the ground plane, wherein the planar structure is composed of a conductive material; and
a pair of vias connecting the planar structure to the ground plane;
wherein the top conductor includes at least one inter-cell path between portions of the top conductor that overlie neighboring cells of the plurality of unit cells, and wherein the at least one inter-cell path is non-linear.

16. The apparatus of claim 15, further comprising:
a dielectric layer disposed between the top conductor and the ground plane, wherein each of the plurality of unit cells is at least partially encapsulated by the dielectric layer.

17. The apparatus of claim 15, wherein the pair of vias of a unit cell of the plurality of unit cells includes a first via connected to a first side of the planar structure and a second via connected to a second side of the planar structure.

18. A method of filtering a signal, the method comprising:
receiving the signal at an input of a top conductor, the top conductor overlying a ground plane;
passing the signal through a plurality of unit cells arranged in series along the top conductor, wherein each of the plurality of unit cells includes:
a planar structure disposed between the top conductor and the ground plane, wherein the planar structure is composed of a conductive material; and
a pair of vias connecting the planar structure to the ground plane;
passing the signal through at least one inter-cell path of the top conductor, wherein the at least one inter-cell path is between portions of the top conductor that overlie neighboring cells of the plurality of unit cells, and wherein the at least one inter-cell path is non-linear; and
outputting the signal at an output of the top conductor.

19. The method of claim 18, wherein the pair of vias of a unit cell of the plurality of unit cells includes a first via connected to a first side of the planar structure and a second via connected to a second side of the planar structure.

20. The method of claim 19, wherein, for the unit cell, the top conductor overlies a center portion of the planar structure that separates the first side and the second side of the planar structure.

* * * * *